United States Patent [19]
Morey

[11] Patent Number: 5,907,799
[45] Date of Patent: May 25, 1999

[54] PROCESS FOR OPERATING AT LEAST ONE RECEIVER OF RADIO SIGNALS, PLACED IN THE VICINITY OF A RADIATING FACILITY OR APPARATUS

[75] Inventor: Gilles Morey, Saint-Ismier, France

[73] Assignee: Atral, Crolles, France

[21] Appl. No.: 08/810,377

[22] Filed: Mar. 3, 1997

[30] Foreign Application Priority Data

Mar. 4, 1996 [FR] France ................................. 9602676

[51] Int. Cl.⁶ .................................................. H04B 1/18
[52] U.S. Cl. ........................................ 455/336; 455/310
[58] Field of Search .................................. 455/214, 215, 455/212, 218, 222, 226.1, 296, 310, 334, 336, 337, 338

[56] References Cited

U.S. PATENT DOCUMENTS

| | | | |
|---|---|---|---|
| 3,746,999 | 7/1973 | Freen ....................................... | 455/334 |
| 5,604,928 | 2/1997 | Hamano et al. ......................... | 455/310 |
| 5,742,902 | 4/1998 | Shore ....................................... | 455/336 |

FOREIGN PATENT DOCUMENTS 0 553 862 A3  8/1993  European Pat. Off. .

*Primary Examiner*—Thanh Cong Le
*Attorney, Agent, or Firm*—Conley, Rose & Tayon

[57] ABSTRACT

A process for allowing two or more receivers to share the same nominal frequency or close nominal frequencies, preferably without these receivers blinding one another or disturbing one another is described. The process preferably includes subjecting a radiator to temporally spaced phases of operation or maximum radiation and temporally segregating the phase sensitivity of the oscillator/detector of the receivers with respect to the phase operation or the radiation of the receiver. The receiver during the phase of sensitivity of its oscillator/detector may not detect the electromagnetic radiation from the radiator.

18 Claims, 6 Drawing Sheets

PROCESS FOR OPERATING AT LEAST ONE RECEIVER OF RADIO SIGNALS, PLACED IN THE VICINITY OF A RADIATING FACILITY OR APPARATUS

BACKGROUND OF THE INVENTION

1. Field of the Invention

The invention generally relates to a process to improve the reception capability of receivers of radio signals, so that reception, analysis or interpretation of the radio signals which they are expecting are improved.

2. Description of the Related Art

The present invention generally relates to a process for operating at least one receiver of radio signals, in particular a superheterodyne receiver or a super-regenerative receiver, able to be arranged in the electromagnetic field of at least one radiating means of a facility or apparatus, in particular an electrical, electronic or electromechanical facility or apparatus which is not destined to transmit.

The said facilities or apparatuses may consist in particular of switches, taken in their general sense, such as microprocessors, transistors, triacs, thyristors, relays or any other facility belonging to an electrical or electronic circuit or an installation, especially when they operate or radiate by periodic pulses.

The said facilities or apparatuses can also consist of super-regenerative receivers, the latter having the particular feature of radiating electromagnetic energy on their nominal frequency via their antenna. It is desirable, in this particular case, to make two or more receivers share the same nominal frequency or close nominal frequencies, without these receivers blinding one another or disturbing one another. It is also desirable that the process may also be used in the case of coupling by conduction or induction between a receiver and a facility generating interference on the nominal frequency of this receiver or on its intermediate frequency.

SUMMARY OF THE INVENTION

An embodiment is aimed firstly at enhancing super-regenerative receivers and concerns more precisely a process for operating at least one receiver of radio signals comprising an antenna, a super-regenerative oscillator/detector and means for fixing periods composed of blocking/unblocking sequences for this oscillator/detector so as to render this oscillator/detector sensitive to the energy received on a nominal reception frequency (f1), the said oscillator/detector exhibiting, in each of the said periods, a phase of sensitivity (A) followed by a phase of amplitude rise or increased amplitude (B, C) and then of decay (D) of its oscillations, the said receiver being able to be arranged in the electromagnetic field radiated by at least one radiating means of a facility or apparatus, in particular an electrical, electronic or electromechanical facility or apparatus, at a distance such that the said receiver is capable of detecting or of being sensitive to this radiated electromagnetic field especially on its nominal reception frequency.

The above operating process includes subjecting the said radiating means to temporally spaced phases of operation or of maximum radiation, and in temporally segregating the phase of sensitivity (A) of the oscillator/detector of the said receiver with respect to the phase of operation or of radiation of the said radiating means, so that the said receiver, during the phase of sensitivity (A) of its oscillator/detector, does not detect the electromagnetic radiation from the said radiating means.

The process includes temporally segregating the phase of sensitivity (A) of the oscillator/detector of the said receiver with respect to the phase of operation or of radiation of the said radiating means by disabling, blocking or halting the procedure of operation or of radiation of the said radiating means during the phase of sensitivity (A) of the oscillator/detector of the said receiver.

The process includes temporally segregating the phase of sensitivity (A) of the oscillator/detector of the said receiver with respect to the phase of operation or of radiation of the said radiating means by disabling, blocking or halting the procedure of operation of the oscillator/detector during the phase of operation or of radiation of the said radiating means.

The process includes detecting the electromagnetic radiation from the said radiating means and in temporally segregating the phase of sensitivity (A) of the oscillator/detector of the said receiver with respect to the phase of operation or of radiation of the said radiating means by temporally shifting the aforesaid phases of operation or of radiation of the said radiating means by a predetermined time value.

The process includes detecting the electromagnetic radiation from the said radiating means and in temporally segregating the phase of sensitivity (A) of the oscillator/detector of the said receiver with respect to the phase of operation or of radiation of the said radiating means by temporally shifting the said phases of sensitivity of the oscillator/detector of the said receiver by a predetermined time value.

The process includes comparing at least one characteristic of the radio signals received by the said receiver with a corresponding characteristic of an expected signal and in delivering to the said means for fixing periods composed of blocking/unblocking sequences a command to shift, by a specified time value, the said periods in the case in which these compared characteristics are different.

An embodiment also concerns a process for operating at least two receivers of radio signals comprising respectively an antenna, a super-regenerative oscillator/detector and means for fixing periods composed of blocking/unblocking sequences for this oscillator/detector so as to render these oscillator/detector [sic] sensitive to the energy received on a common nominal reception frequency (f1) or on two close frequencies, the said oscillators/detectors respectively exhibiting, in each of the said periods, a phase of sensitivity (A) followed by a phase of amplitude rise or increased amplitude (B, C) and then of decay (D) of their oscillations, the said receivers being able to be arranged at a distance such that at least one of the said receivers is capable of detecting or of being sensitive to the electromagnetic field able to be emitted by the other.

The above process consists in temporally segregating the phases of sensitivity (A) of the oscillator/detector of one of the said receivers from the aforesaid phases of amplitude rise or increased amplitude (B, C) and then of decay (D) of the oscillations of the oscillator/detector of the other receiver, so that one of the receivers, during the phase of sensitivity of its oscillator/detector, does not detect the electromagnetic energy able to be radiated by the other receiver on the said nominal frequency or the said close frequencies.

The process includes making the oscillators/detectors of the said receivers oscillate according to periods composed of simultaneous or synchronous or identical blocking/unblocking sequences.

The process includes subjecting the oscillators/detectors of the said receivers to a common clock determining the said oscillation sequences of the oscillator/detector of these receivers.

The process includes detecting by one of the said receivers the electromagnetic radiation radiated by the other and in supplying its means for fixing periods composed of blocking/unblocking sequences with a command to shift, by specified time value, the said periods of its oscillator/detector.

An embodiment also concerns a process for operating at least one receiver of radio signals able to be arranged in the electromagnetic field of at least one radiating means of a facility or apparatus, in particular an electrical, electronic or electromechanical facility or apparatus, at a distance such that the said receiver is capable of detecting or of being sensitive to this radiated electromagnetic field.

The above process includes subjecting the said receiver to temporally spaced phases of listening or of sensitivity, in subjecting the said radiating means to temporally spaced phases of operation or of radiation, and in temporally segregating the phase of listening or of sensitivity of the said receiver with respect to the phase of operation or of radiation of the said radiating means so that the said receiver, during its phase of listening or of sensitivity, does not detect or is not sensitive to the electromagnetic field of the said radiating means.

The process includes temporally segregating the phase of listening or of sensitivity of the said receiver with respect to the phase of operation or of radiation of the said radiating means of the said facility by temporally fixing the said phases of listening or of sensitivity of the said receiver as a function of the phases of operation or of radiation of the said radiating means.

The process includes temporally segregating the phase of listening or of sensitivity of the said receiver with respect to the phase of operation or of radiation of the said radiating means of the said facility by temporally fixing the said phases of operation or of radiation of the said radiating means as a function of the said phases of listening or of sensitivity of the said receiver.

The process according to the invention can advantageously consist in comparing at least one characteristic of the radio signals received by the said receiver with a corresponding characteristic of an expected signal and in shifting the said temporally spaced phases of listening or of sensitivity of the said receiver, by a specified time value, in the case in which these compared characteristics are different.

The process includes comparing at least one characteristic of the radio signals received by the said receiver with a corresponding characteristic of an expected signal and in modifying the duration of the said temporally spaced phases of listening or of sensitivity of the said receiver and, correspondingly, in segregating the said phases of operation or of radiation of the said radiating means, by a specified time value, in the case in which these compared characteristics are identical.

The process includes subjecting the said receiver and/or the said radiating means to common sequencing means determining their aforesaid respective phases.

The process includes performing the said modification of the duration of the said phases of listening or of sensitivity of the said receiver by prolonging, by a specified time value, the duration of the phase in the course of which the said compared characteristics are identical.

The process includes after reception by the said receiver of an expected signal, in subjecting the said radiating means to temporally spaced phases of operation or of radiation depending on the contents of the said signal received by the said receiver and in subjecting the said receiver to temporally spaced phases of listening or of sensitivity likewise depending on the contents of the said signal received by said receiver.

The process includes subjecting the said radiating means, such as a triac, to temporally spaced phases of operation or of radiation, these phases consisting of periodic pulses or signals for triggering or operating this means.

The said pulses can advantageously [lacuna] in relationship with the periods of an alternating electrical energy source.

BRIEF DESCRIPTION OF THE DRAWINGS

The present invention will be better understood on studying radio signal receivers and their manner of operation, described by way of non-limiting examples and illustrated by the drawing in which.

DETAILED DESCRIPTION OF THE INVENTION

Figure 1:
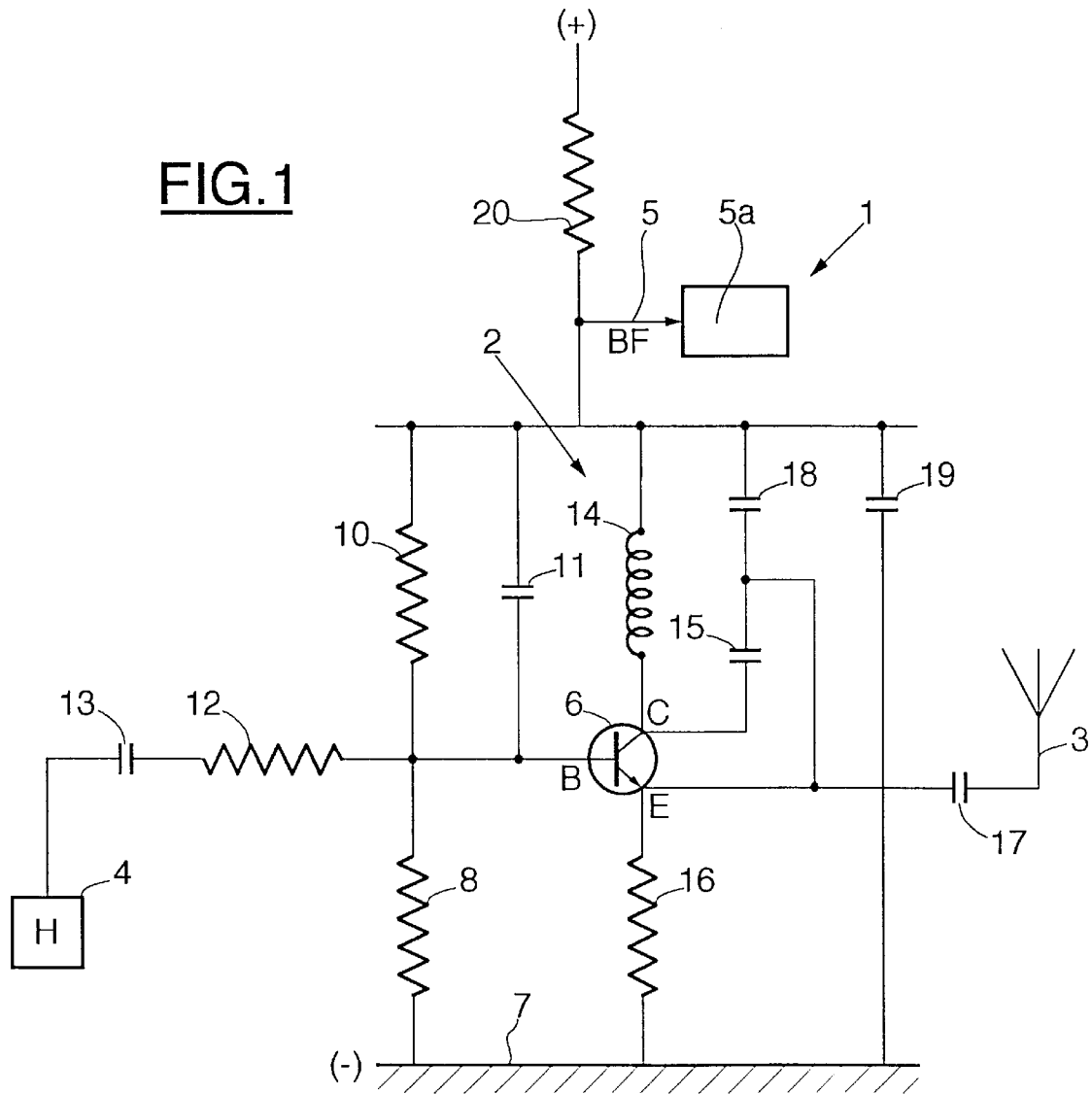
FIG. 1 represents a layout of a receiver comprising a super-regenerative oscillator/detector.

Referring to FIG. 1, it may be seen that the radio signal receiver represented, labeled in a general manner by the reference 1, comprises a super-regenerative oscillator/detector, labeled in a general manner by the reference 2, linked to an antenna 3 for receiving electromagnetic waves, which receives successive signals for blocking/unblocking a sequencing clock 4 enabling it to oscillate on its nominal reception fequency f1 periodically during oscillation sequences of a determined duration and delivering on an output point 5 a low-frequency LF signal directed to a processing facility 5a.

In the example represented, the oscillator/detector 2 comprises an active element consisting of a transistor 6 whose base is linked to the (−) pole of a supply or ground 7 by way of a resistance 8, to the point 5 via a resistance 10 and a capacitance 11 in parallel, and to the clock 4 via a resistance 12 and a capacitance 13.

The collector of the transistor 6 is linked to the point 5 by way of a self-inductance 14 constituting a reactive element, and to its emitter by way of a feedback capacitance 15.

The emitter of the transistor 6 is linked to the (−) pole via a resistance 16, to the antenna 3 via a capacitance 17 and to the point 5 by an impedance matching capacitance 18.

A filtering capacitance 19 links the point 5 to ground 7.

The point 5 is linked to the (+) pole of the power supply through a resistance 20, detection of the low-frequency (LF) modulation being done by extracting the variation in the mean current consumed by the oscillator/detector stage 2.

Figure 2:
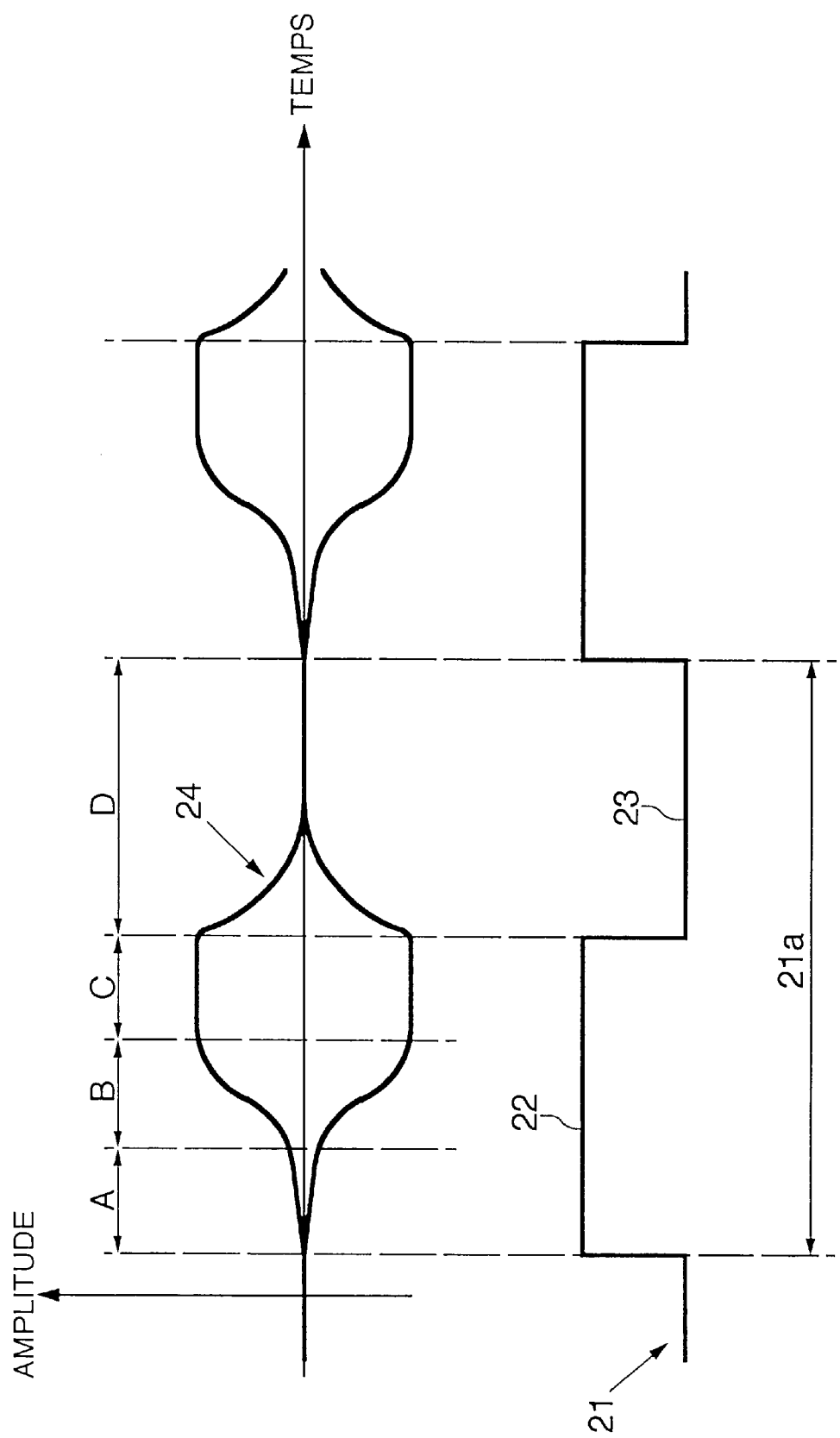
FIG. 2 represents an operating diagram for this super-regenerative receiver.

Referring to FIG. 2 it may be seen that this represents a general operating diagram of the receiver 1 of FIG. 1.

Represented in this FIG. 2 may be seen the shape of a strobe control signal 21 determining periods 21a of blocking/unblocking of the oscillator/detector 2. This signal is delivered by the clock 4 which fixes in each period 21a, cyclically, unblocking sequences 22 followed by blocking sequences 23 for this oscillator/detector 2.

Also represented in FIG. 2, in correspondence with the clock signal 21, is a particular envelope curve, labeled in a general manner by the reference 24, of the amplitude of the oscillations of the oscillator/detector 2 in the logarithmic mode.

It may be seen that this curve 24 comprises in each unblocking sequence 22 for the oscillator/detector 2 a phase A of sensitivity, followed by a phase B of growth of the amplitude of the oscillations of the oscillator/detector 2, followed by a phase C of stabilization of this amplitude and followed, in the blocking sequence 23, by a phase D of progressive and rapid decline of this amplitude. The phase C need not exist and, in the so-called linear mode of detection, not represented, phase D would come before the end of phase B.

Since the antenna 3 is linked to the oscillator/detector 2, the oscillation phases B, C and D generate via this antenna electromagnetic energy which radiates about the latter [sic] up to a specified distance, the radiation during the phase of sensitivity A being very weak and, so to speak, negligible.

Figure 3:
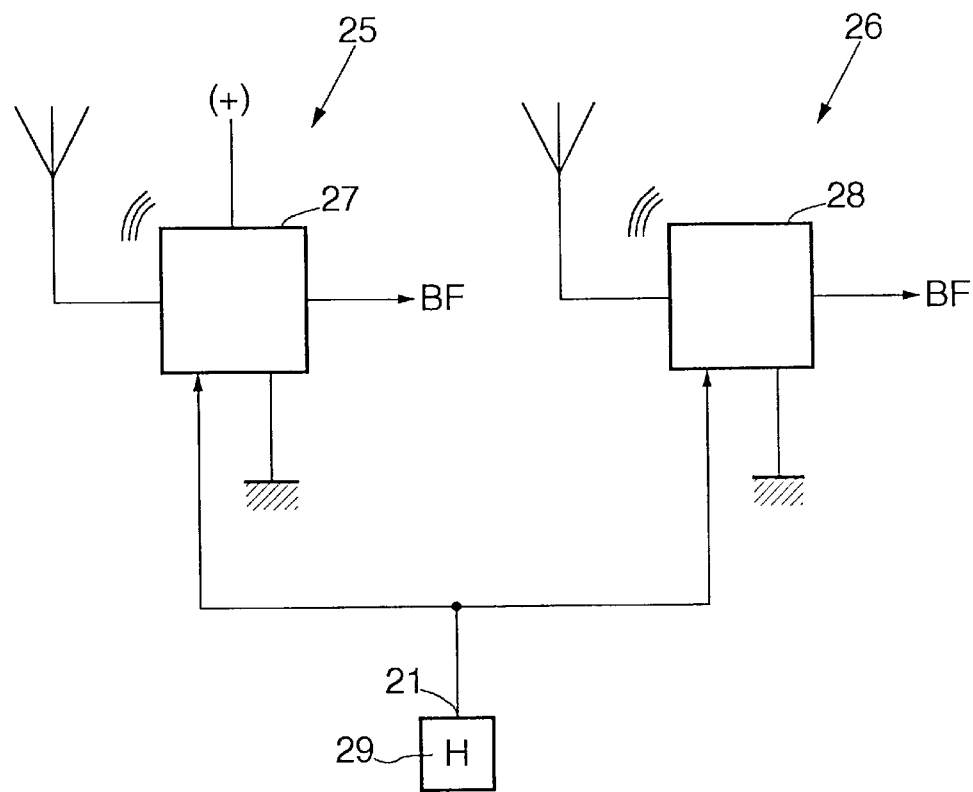
FIG. 3 represents a first embodiment of receivers according to the present invention.

Referring to the example represented in FIG. 3, it may be seen that this represents two radio signal receivers 25 and 26, for example identical to the receiver 1 of FIG. 1, comprising identical oscillators/detectors 27 and 28, which are subjected to the same clock signal 21 delivered by a common sequencing clock 29, which determines the successive periods 21a and, within these periods, the start and duration of the aforesaid sequences 22 and 23, these sequences consequently being simultaneous, synchronous or identical for each of the receivers.

Thus, the phases of sensitivity A of the oscillators/detectors of the receivers 25 and 26 occur substantially simultaneously, as do the increased-amplitude phases B, C and D.

As a result, the increased-amplitude phases B, C and D of one of the receivers 26 or 27, which gives rise to disturbing electromagnetic energy emitted by its antenna, do not occur simultaneously with the phase of sensitivity A of the other receiver, so that the receivers 25 and 26 cannot disturb one another even if they are in the electromagnetic field which they emit during their phase B, C and D. In other words, the periodic phases of sensitivity A of one of the said super-regenerative receivers are segregated from the increased-amplitude phases B, C and D of the other super-regenerative receiver.

In a particular application, it thus becomes possible to listen to a wide band of frequencies by placing several super-regenerative receivers in parallel, tuned to adjoining or close reception frequencies and controlled synchronously by a common clock without them disturbing one another. Together, these receivers can advantageously constitute a system for monitoring a wide frequency band.

Figure 4:
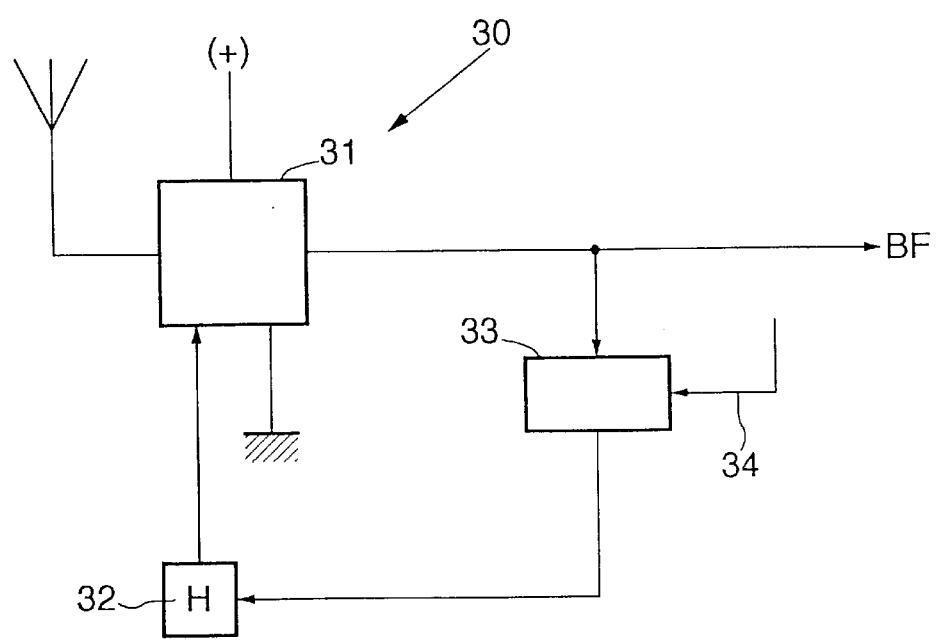
FIG. 4 represents a second embodiment of a receiver according to the present invention.

Referring to another example represented in FIG. 4, it can be seen that this represents a radio signal receiver 30 comprising an oscillator/detector 31, corresponding to that of FIG. 1, and a sequencing clock 32.

This receiver furthermore comprises a processing facility 33 which receives the LF output signals from the oscillator/detector 31. This processing facility 33 comprises a comparator which makes it possible to compare at least one characteristic of the LF signals received with a corresponding characteristic, for example the shape, of a reference signal 34, in particular an expected signal.

If these compared characteristics are different, this facility 33 supplies a time-shift command which is directed to the clock 32.

In a variant, the processing facility 33 could advantageously deliver this control command only after having noted the presence of an unexpected signal in the signals received in a predetermined number of successive sequences 22 and 23 of oscillations of the oscillator/detector 31, for example three.

On reception of the said shift command, the clock 32 shifts the sequences 22 and 23 for blocking/unblocking its oscillator/detector 31 forward or backwards by a predetermined time value, this value preferably corresponding to a fraction of the duration of the sequences 22 and 23.

These received but unexpected signals may be of very different origins. They may stem from neighbouring facilities or apparatuses, not represented, comprising at least one means operating by periodic pulses generating an electromagnetic field, these facilities being placed at a distance from the receiver 30 such that the said receiver 30 is capable of detecting or is sensitive to this disturbing electromagnetic field.

Following one or possibly several shifts of the clock 32, the phases of sensitivity A of the oscillator/detector 31 end up being segregated from the phases of radiation of the said neighbouring facilities or apparatuses so that the receiver 30 is no longer disturbed by the electromagnetic field radiated by these facilities or apparatuses. Of course, if a new disturbance is detected, the aforesaid shifting procedure recurs.

In a particular example, the received but unexpected signals may stem from a neighbouring super-regenerative receiver, not represented, identical or similar to the receiver 30, which transmits, on an identical or close frequency and according to an identical or close sequencing, electromagnetic energy via its antenna due to the aforesaid phases B, C and D of its oscillator/detector, this receiver 30 and this neighbouring receiver being placed at a distance such that the electromagnetic energy emitted by the antenna of one is able to be picked up by the other.

In this case, the processing facility 33 sends a command to time-shift the clock signal 21 delivered by the clock 32 of this receiver 30, by a specified value, for example equal to a tenth of the duration of its period 21a. It follows that the phase of sensitivity A of the receiver 31 slides over time with respect to the phase of sensitivity A of the said neighbouring receiver.

By repetition of these slidings over time due to the detection of the unexpected signal stemming from the said neighbouring receiver in successive sequences of the detector 30, a moment arrives at which the phase of sensitivity A of the receiver 31 and the phase of sensitivity A of the said neighbouring receiver are simultaneous or almost simultaneous. Then, the receiver 30 and the said neighbouring receiver do not disturb one another and their manners of operation correspond to those described with reference to FIG. 3, with no common clock, their phases of sensitivity and their phase of increased-amplitude oscillation being segregated.

The above example is therefore well suited to the mutual desensitizing of independent receivers 30 each having their own sequencing clock.

In other examples, the facility or apparatus neighbouring the receiver 30 and radiating by periodic pulses an electromagnetic field could be an electrical or electronic switch such as a microprocessor, a transistor, a triac, a thyristor, a relay or any other electrical, electronic or electromechanical facility not destined to transmit.

On receiving disturbing electromagnetic signals transmitted by these facilities, the receiver 30 would operate as described previously so as to give rise to one or more shifts of the sequencing of the operation of its oscillator/detector 31 by shifting of the clock 32, until the effect of their disturbing field on the receiver 30 disappears.

Figure 5:
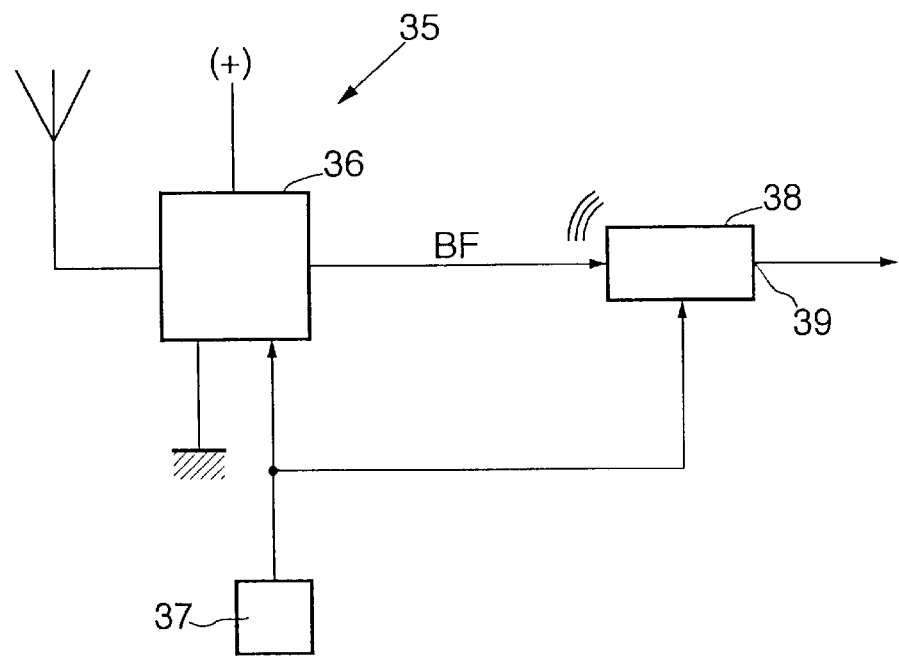
FIG. 5 represents a third embodiment of a receiver according to the present invention.

Referring to another example represented in FIG. 5, it may be seen that this represents a receiver 35 comprising an oscillator/detector 36 and a sequencing clock 37, which is associated with an electrical or electronic circuit 38, in particular one for processing the LF signal delivered by this oscillator/detector 36, it being possible for this circuit 38 to be a microprocessor delivering a command signal at its output 39.

The clock 37 is advantageously linked to the microprocessor 38 and delivers a signal to it which is such that this microprocessor 38 is blocked or halts its operation during the phase of sensitivity A of the oscillator/detector 36, for example by stopping its internal clock, that is to say permits the operation of this microprocessor 38 only outside of this phase of sensitivity A.

Thus, the disturbing electromagnetic field, radiated or conducted, emitted by the microprocessor 38 during phases B, C and D of oscillation of the oscillator/detector 36 of the receiver 35 is not able to disturb the signal received and expected by this receiver, the successive phases of sensitivity A of the oscillator/detector 36 consequently being segregated from the phases of operation of the microprocessor 38.

In other examples, the clock 37 could transmit a signal for blocking or timing-out or shifting the operating procedure to any other means or facilities 38 which might be linked or be electrically linkable to the receiver 35, such as a transistor, a triac, a thyristor, a relay or any other electronic processing or electrical circuit not destined to transmit, so that their phases of operation are segregated from the successive phases of sensitivity A of the oscillator/detector 36.

Figure 6:
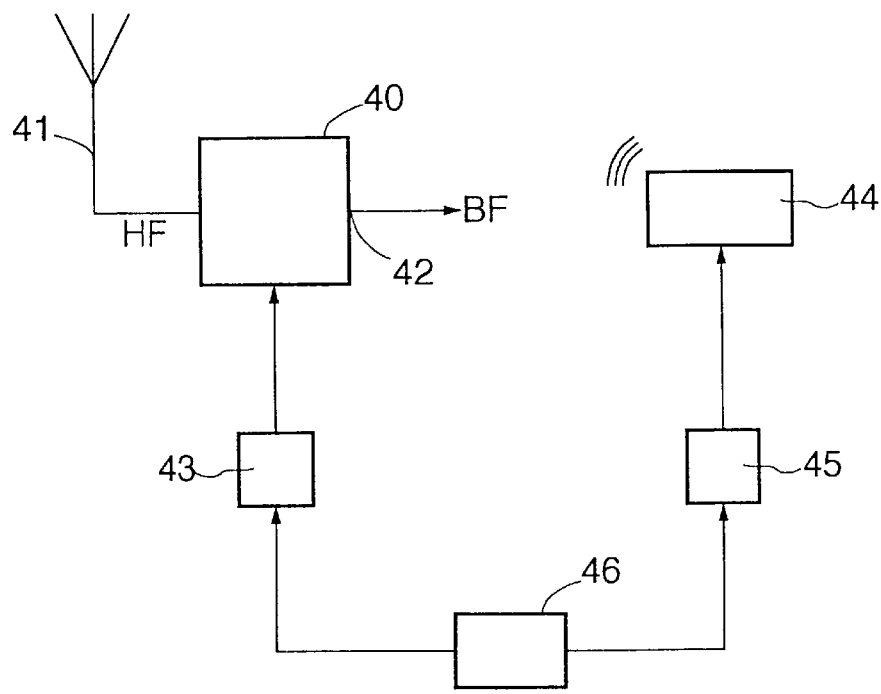
FIG. 6 represents another embodiment of a receiver according to the present invention.

Referring [lacuna] the example of FIG. 6, it may be seen that this represents a radio signal receiver 40 adapted to receive via its antenna 41 high-frequency radio signals so as to deliver low-frequency signals at its output 42. This receiver 40 can be of any known type, for example a super-regenerative or super-heterodyne receiver.

This receiver 40 is subjected to a sequencer 43, for example comprising a sequencing clock, which imposes thereon temporally spaced phases of listening or of sensitivity, which are separated by phases of disabling or of absence of listening or of insensitivity. In a particular example, these temporally spaced phases of listening or of sensitivity of the receiver 40 can be periodic.

The receiver 40 is be [sic] arranged in proximity to an electronic processing or electrical facility or apparatus 44 radiating an electromagnetic field such that the receiver 40 is capable of detecting or of being sensitive to this radiated electromagnetic field, it being possible for this facility or apparatus to be one of those mentioned earlier.

The facility 44 is subjected to a sequencer 45 which comprises for example a sequencing clock and which determines temporally spaced phases of operation of this facility 44, separated by phases of non-operation, so that this facility 44 can radiate an electromagnetic field only during its phases of operation. In a particular example, the phases of operation of the radiating facility 44 can be periodic.

The sequencers 43 and 45 are subjected to a segregating circuit 46 which makes it possible temporally to segregate the aforesaid phases of listening or of sensitivity of the receiver 40 imposed by the sequencer 43 with respect to the aforesaid phases of operation of the radiating facility 44 determined by the sequencer 45.

Thus, on the one hand the receiver 40 is in the phase of listening or of sensitivity when the radiating facility 44 is off and on the other hand the radiating facility 44 is operating when the receiver 40 is not in the phase of listening or of sensitivity, so that the receiver 40 does not detect or is not sensitive, in particular on its nominal reception frequency, to the electromagnetic field of the radiating facility 44.

Figure 7:
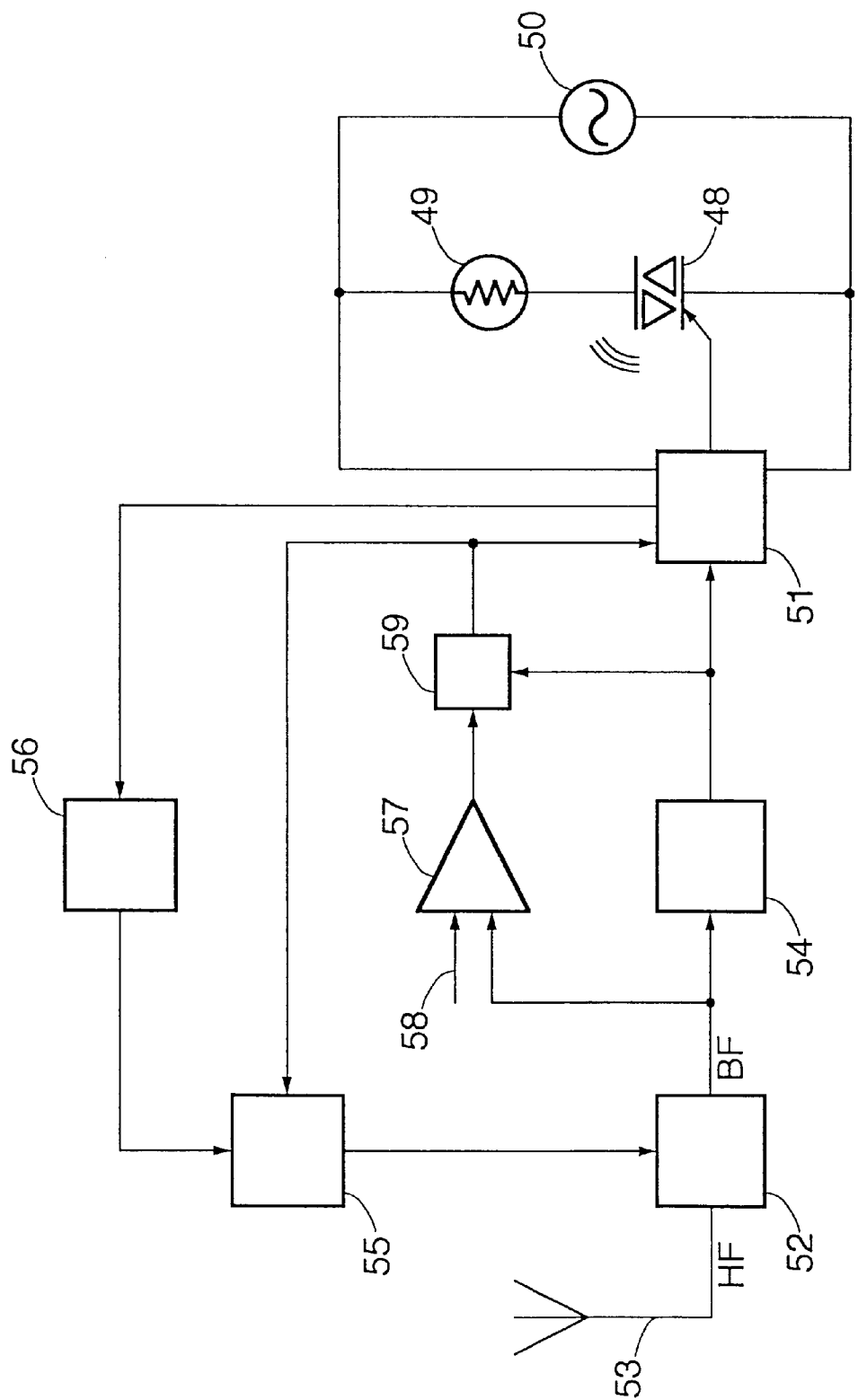
FIG. 7 represents an embodiment of a receiver adapted to a variator according to the present invention.

Referring to the example of FIG. 7, a variator will now be described, labeled in a general manner by the reference 47, for example a variator of the light emitted by an incandescent bulb or a variator of the electrical power supply to a heating resistor, remotely controlled by radio signals.

This variator 47 comprises a triac 48 mounted in series with a load resistance 49 across the terminals of an electrical current source 50, for example the 50 hertz A.C. electrical network.

The triac 48 is subjected to a triggering sequencer 51 which provides it with periodic triggering or operating pulses in relationship with the periods of the electrical power source 50.

The variator 47 comprises a receiver 52, for example a super-heterodyne or super-regenerative receiver, able to receive radio signals via its antenna 53 and delivering the signals received, at low frequency, to a decoder 54 whose commands output is linked to the sequencer 51 for triggering the triac 48.

The receiver 52 is subjected to a sequencer 55 which determines temporally spaced phases of operation of this receiver 52.

The sequencer 51 delivers control pulses to a circuit for temporal segregation 56 whose output is linked to the sequencer 55.

The output for the LF low frequency signals of the receiver 52 is also linked to a comparator 57 whose other input is linked to a reference signal 58. The output of this comparator is linked to the input of a time-out circuit 59 which furthermore receives the output signal from the decoder 54. The output of this time-out circuit 59 is linked to a disabling input of the triggering sequencer 51 and to a prolongation input of the sequencer 55.

Figure 8:
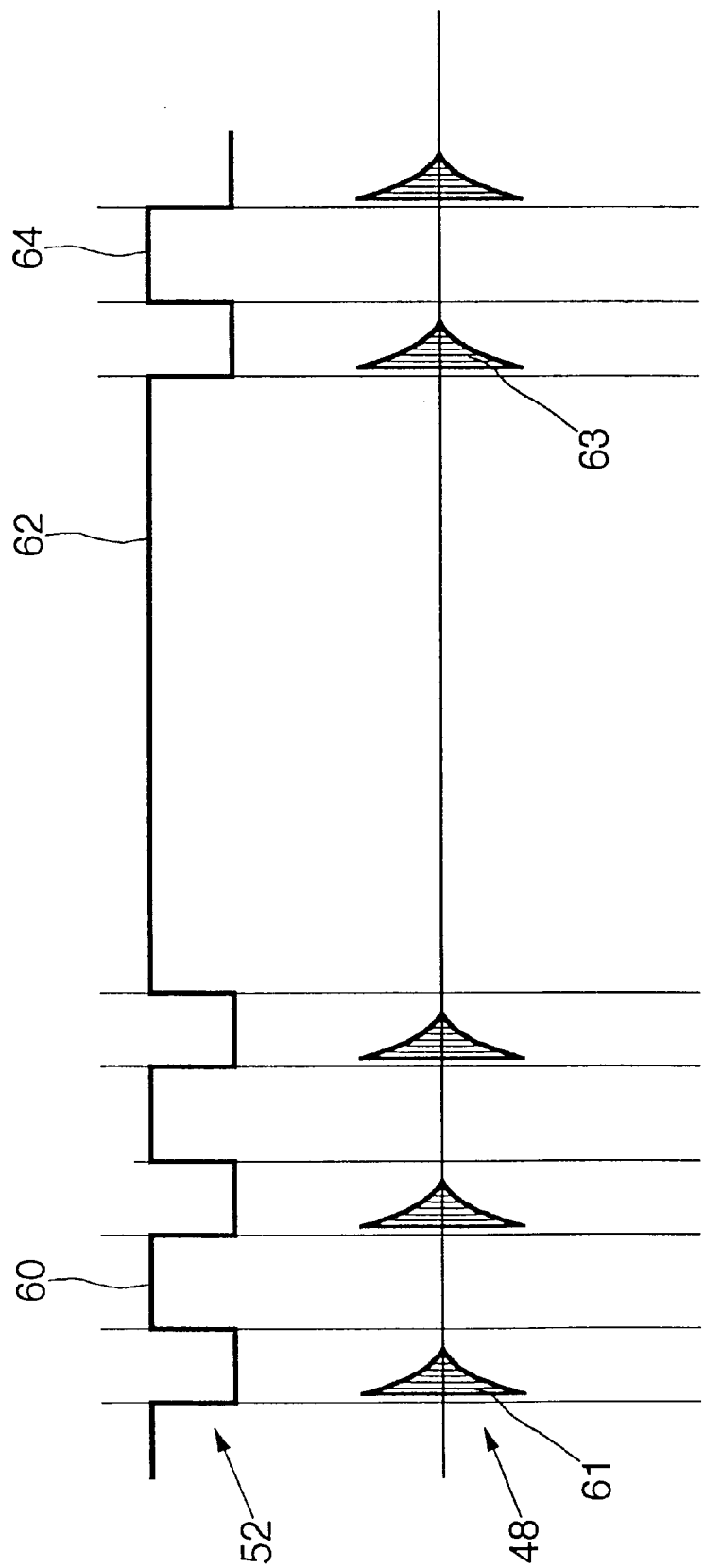
FIG. 8 represents a mode of operation of the variator of FIG. 7.

With reference to FIG. 8, the manner in which the variator 47 operates will now be described.

In the absence of reception by the receiver 52 of a signal containing a command to be delivered to the triggering sequencer 51, this sequencer 51 operates the triac 48 in accordance with the command which it has previously received and delivers pulses to the segregating circuit 56 which are such that the sequencer 55 causes the receiver 52 to operate according to phases of listening or of sensitivity 60 which are situated between the phases 61 of electromagnetic radiation of the triac 48 which are due to its periodic pulses for chopping the current of the electrical network, the receiver 52 consequently being disabled during the phases 61 of electromagnetic radiation of the triac 48 and consequently not detecting or not being sensitive to this radiation.

If, during a phase of listening or of sensitivity of the receiver 52, this receiver 52 receives a radio signal, the comparator 57 compares the start of this signal with an expected signal 58. If the start of the signal received and this expected signal are identical, the comparator 57 triggers the time-out circuit 59 which delivers an off signal or a signal for disabling the triggering sequencer 51 so as to block the latter in such a way as to halt the operation of the triac 48 and, at the same time, delivers a command to the sequencer 55 for prolongation of the phase of listening or of sensitivity of the receiver 52.

When the decoder 54 has been able to decode the signal received and expected during its prolonged phase of listening or of sensitivity 62, this decoder 54 delivers a command on the one hand to the time-out circuit 59 such that the sequencer 55 ceases the prolonged phase of listening or of sensitivity 62, and on the other hand to the triggering sequencer 51 which can then operate the triac 58 in accordance with the contents of the control command received, for example a modification of the duration of the periods of its pulses for controlling the triac 48. The variator 47 then resumes its mode of operation described above, modified according to the new periodicity of the operating phases of the triac 48, such that, during the phases of electromagnetic radiation of the triac 48, the receiver 52 is disabled.

Moreover, the time-out circuit 59 makes it possible to limit the duration of the prolonged phases of listening or of sensitivity 62 of the receiver 52 as a function of the duration of the expected radio control signal should the decoder 54 be unable fully to interpret the radio signal received.

Thus, in the absence of an expected signal, the triggering sequencer 51 imposes the phases of listening or of sensitivity of the receiver 52 whilst during reception of an expected signal, it is the time-out circuit 59 which imposes itself with respect to the sequencer 51.

The present invention is not limited to the examples described above. Many variant embodiments are possible without departing from the framework defined by the appended claims. In particular, the invention could moreover be applied solely to the intermediate frequency or baseband amplification part of frequency-changing receivers.

I claim:

1. Process for operating at least one receiver of radio signals comprising an antenna, a super-regenerative oscillator/detector and means for fixing periods composed of blocking/unblocking sequences for this oscillator/detector so as to render this oscillator/detector sensitive to the energy received on a nominal reception frequency, the said oscillator/detector exhibiting, in each of said periods, a phase of sensitivity followed by a phase of amplitude rise or increased amplitude and then of decay of its oscillations, the said receiver being able to be arranged in the electromagnetic field radiated by at least one radiating means of a facility or apparatus, in particular an electrical, electronic or electromechanical facility or apparatus, at a distance such tat the said receiver is capable of detecting or of being sensitive to this radiated electromagnetic field especially on its nominal reception frequency, comprising:

subjecting the said radiating means to temporally spaced phases of operation or of maximum radiation, and temporally segregating the phase of sensitivity of the oscillator/detector of the said receiver with respect to the phase of operation or of radiation of the said radiating means by disabling, blocking or halting the procedure of operation or of radiation of the said radiating means during the phase of sensitivity of the oscillator/detector of the said receiver, so that the said receiver, during the phase of sensitivity of its oscillator/detector, does not detect the electromagnetic radiation from the said radiating means.

2. Process for operating at least one receiver of radio signals comprising an antenna, a super-regenerative oscillator/detector and means for fixing periods composed of blocking/unblocking sequences for this oscillator/detector so as to render his oscillator/detector sensitive to the energy received on a nominal reception frequency, the said oscillator/detector exhibiting, in each of said periods, a phase of sensitivity followed by a phase of amplitude rise or increased amplitude and than of decay of its oscillations, the said receiver being able to be arranged in the electromagnetic field radiated by at least one radiating means of a facility or apparatus, in particular an electrical, electronic or electromechanical facility or apparatus, at a distance such that the said receiver is capable of detecting or of being sensitive to this radiated electromagnetic field especially on its nominal reception frequency, comprising:

subjecting the said radiating means to temporally spaced phases of operation or of maximum radiation, detecting the electromagnetic radiation from the said radiating means; and temporally segregating the phase of sensitivity of the oscillator/detector of the said receiver with respect to the phase of operation or of radiation of the said radiating means by temporally shifting the aforesaid phases of operation or of radiation of the said radiating means by a predetermined time value, so that the said receiver, during the phase of sensitivity of its oscillator/detector, does not detect the electromagnetic radiation from the said radiating means.

3. Process for operating at least one receiver of radio signals comprising an antenna, a super-regenerative oscillator/detector and means for fixing periods composed of blocking/unblocking sequences for this oscillator/detector so as to render this oscillator/detector sensitive to the energy received on a nominal reception frequency, the said oscillator/detector exhibiting, in each of said periods, a phase of sensitivity followed by a phase of amplitude rise or increased amplitude and then of decay of its oscillations, the said receiver being able to be arranged in the electromagnetic field radiated by at least one radiating means of a facility or apparatus, in particular an electrical, electronic or electromechanical facility or apparatus, at a distance such that the said receiver is capable of detecting or of being sensitive to this radiated electromagnetic field especially on its nominal reception frequency, comprising:

subjecting the said radiating mews to temporally spaced phases of operation or of maximum radiation, comparing at least one characteristic of the radio signals received by the said receiver with a corresponding characteristic of an expected signal; and temporally segregating the phase of sensitivity of the oscillator/detector of the said receiver with respect to the phase of operation or of radiation of the said radiating means by supplying the said means for fixing periods composed of blocking/unblocking sequences with a command to shift, by a specified time value, the said periods in the case in which these compared characteristics are different, so that the said receiver, during the phase of sensitivity of its oscillator/detector, does not detect the electromagnetic radiation from the said radiating means.

4. Process for operating at least two receivers of radio signals comprising respectively an antenna, a super-regenerative oscillator/detector and means for fixing periods composed of blocking/unblocking sequences for his oscillator/detector so as to render these oscillator/detectors sensitive to the energy received on a common nominal reception frequency or on two close frequencies, the said oscillators/detectors respectively exhibiting, in each of the said periods, a phase of sensitivity followed by a phase of amplitude rise or increased amplitude, and then of decay of their oscillations, the said receivers being able to be arranged at a distance such that at least one of the said receivers is capable of detecting or of being sensitive to the electromagnetic field able to be emitted by the other, comprising in temporally segregating the phases of sensitivity of the oscillator/detector of one of the said receivers from the aforesaid phases of amplitude rise or increased amplitude and then of decay of the oscillations of the oscillator/detector of the other receiver, by making he oscillators/detectors of the said receivers oscillate according to periods composed of simultaneous or synchronous or identical blocking/unblocking sequences, so that one of the receivers, during the phase of sensitivity of its oscillator/detector, does not detect the electromagnetic energy able to be radiated by the other receiver on the said nominal frequency or the said close frequencies.

5. Process according to claim 4, further comprising subjecting the oscillators/detectors of the said receivers to a common clock determining the said oscillation sequence of the oscillator/detector of these receivers.

6. Process for operating at least one receiver of radio signals able to be arranged in the electromagnetic field of at least one radiating means of a facility or apparatus, in particular an electrical, electronic or electromechanical facility or apparatus, at a distance such that the said receiver is capable of detecting or of being sensitive to this radiated electromagnetic field, comprising:

subjecting the said receiver to temporally spaced phases of listening or of sensitivity, subjecting the said radiating means to temporally spaced phases of operation or of radiation, comparing at least one characteristic of the radio signals received by the said receiver with a corresponding characteristic of an expected signal, and temporally segregating the phase of listening or of sensitivity of the said receiver with respect to the phase of operation or of radiation of the said radiating means by shifting the said temporally spaced phases of listening or of sensitivity of the said receiver, by a specified time value, in the case in which the said compared characteristics are different, so that the said receiver, during its phase of listening or of sensitivity, does not detect or is not sensitive to the electromagnetic field of the said radiating means.

7. Process for operating at least one receiver of radio signals able to be arranged in the electromagnetic field of at least one radiating means of a facility or apparatus, in particular an electrical, electronic or electromechanical facility or apparatus, at a distance such that the said receiver is capable of detecting or of being sensitive to this radiated electromagnetic field, comprising:

subjecting the said receiver to temporally spaced phases of listening or of sensitivity, subjecting the said radiating means after reception by the said receiver of an expected signal to temporally spaced phases of operation or of radiation, comparing at least one characteristic of the radio signals received by the said receiver with a corresponding characteristic of an expected signal, and temporally segregating the phase of listening or of sensitivity of the said receiver with respect to the phase of operation or of radiation of the said radiating means by modifying the duration of the said temporally spaced phases of listening or of sensitivity of the said receiver, and correspondingly, in segregating the said phases of operation or of radiation of the said radiating means, by a specified time value, in the case in which the said compared characteristics are different, so that the said receiver, during its phase of listening or of sensitivity, does not detect or is not sensitive to the electromagnetic field of the said radiating means.

8. Process according to claim 7, when performing the said modification of the duration of the said phases of listening or of sensitivity of the said receiver by prolonging, by a specified time value, the duration of the phase in the course of which the said compared characteristics are identical.

9. Process according to claim 8, further comprising subjecting the said radiating means to temporally spaced phases of operation or of radiation depending on the contents of the said signal received by the said receiver and in subjecting the said receiver to temporally spaced phases of listening or of sensitivity likewise depending on the contents of the said signal received by the said receiver, after reception by the said receiver of an expected signal.

10. Process according to claim 9, further comprising subjecting the said radiating means, such as a triac, to temporally spaced phases of operation or of radiation, these phases consisting of periodic pulses or signals for triggering or operating this means.

11. Process according to claim 10, wherein said pulses are in relationship with the periods of an alternating electrical energy source.

12. Process according to claim 8, further comprising subjecting the said radiating means, such as a triac, to temporally spaced phases of operation or of radiation, these phases consisting of periodic pulses or signals for triggering or operating this means.

13. Process according to claim 12, wherein said pulses are in relationship with the periods of an alternating electrical energy source.

14. Process according to claim 7, further comprising subjecting the said radiating means to temporally spaced phases of operation or of radiation depending on the contents of the said signal received by the said receiver and in subject the said receiver to temporally spaced phases of listening or of sensitivity likewise depending on the contents of the said signal received by the said receiver, after reception by the said receiver of an expected signal.

15. Process according to claim 14, further comprising subjecting the said radiating means, such as a triac, to temporally spaced phases of operation or of radiation, these phases consisting of periodic pulses or signals for triggering or operating this means.

16. Process according to claim 15, wherein said pulses are in relationship with the periods of an alternating electrical energy source.

17. Process according to claim 7, further comprising subjecting the said radiating means, such as a triac, to temporally spaced phases of operation or of radiation, these phases consisting of periodic pulses or signals for triggering or operating this means.

18. Process according to claim 17, characterized in that the said pulses are in relationship with the periods of an alternating electrical energy source.

* * * * *

UNITED STATES PATENT AND TRADEMARK OFFICE
CERTIFICATE OF CORRECTION

PATENT NO. : 5,907,799
DATED : May 25, 1999
INVENTOR(S) : Gilles Morey

It is certified that error appears in the above-identified patent and that said Letters Patent is hereby corrected as shown below:

In the Claims:

Claim 1, col. 9, line 54, please delete "tat" and substitute --that--.
Claim 2, col. 10, line 8, please delete "his" and substitute --this--.
Claim 2, col. 10, line 12, please delete "than" and substitute --then--.
Claim 3, col. 10, line 50, please delete "mews" and substitute --means--.
Claim 4, col. 11, line 2, please delete "his" and substitute --this--.
Claim 4, col. 11, line 16, please delete "he" and substitute --the--.
Claim 8, col. 12, line 13, please delete "when" and substitute --wherein--.

Claim 14, col. 12, line 46, please delete "subject" and substitute --subjecting--.

Signed and Sealed this

Fifth Day of December, 2000

Attest:

Q. TODD DICKINSON

Attesting Officer

Director of Patents and Trademarks